US012795939B2

(12) United States Patent
Servalli et al.

(10) Patent No.: US 12,795,939 B2
(45) Date of Patent: Nov. 10, 2026

(54) FERROELECTRIC MEMORY ARRAYS WITH LOW PERMITTIVITY DIELECTRIC BARRIERS

(71) Applicant: Micron Technology, Inc., Boise, ID (US)

(72) Inventors: Giorgio Servalli, Fara Gera d'Adda (IT); Marcello Mariani, Milan (IT); Kamal Karda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 528 days.

(21) Appl. No.: 18/203,886

(22) Filed: May 31, 2023

(65) Prior Publication Data

US 2023/0397428 A1 Dec. 7, 2023

Related U.S. Application Data

(60) Provisional application No. 63/365,687, filed on Jun. 1, 2022.

(51) Int. Cl.
*H10B 51/30* (2023.01)
*G11C 11/22* (2006.01)
(Continued)

(52) U.S. Cl.
CPC .............. *H10B 51/30* (2023.02); *G11C 11/22* (2013.01); *G11C 11/221* (2013.01); *H10B 51/10* (2023.02);
(Continued)

(58) Field of Classification Search
CPC ........ H10B 51/10; H10B 51/20; H10B 51/30; H10B 53/10; H10B 53/20; H10B 53/30; G11C 11/22; G11C 11/221
See application file for complete search history.

(56) References Cited

U.S. PATENT DOCUMENTS 6,756,262 B1 * 6/2004 Nakamura ............. H10D 1/696 257/E21.018
9,318,693 B2 * 4/2016 Cronin ................... H10N 50/80
(Continued)

FOREIGN PATENT DOCUMENTS

JP 2006210386 A * 8/2006
WO WO-2021056984 A1 * 4/2021 ........... H10B 12/315

*Primary Examiner* — Matthew E Warren
(74) *Attorney, Agent, or Firm* — Holland & Hart LLP

(57) ABSTRACT

Methods, systems, and devices for ferroelectric memory arrays with low permittivity dielectric barriers are described. In some cases, a manufacturing process to manufacture a memory array may include depositing a dielectric barrier between respective bottom electrodes of a pair of adjacent memory cells of the array. For example, the manufacturing process may include depositing a film of dielectric material over rows of bottom electrodes formed on a set of dielectric walls to at least partially fill space between adjacent bottom electrodes. Alternatively, the manufacturing process may include depositing a film of dielectric material into a set of cavities of the memory array, each cavity having a set of bottom electrodes formed on sidewalls of the cavity. Subsequently, a portion of the dielectric material may be removed to expose surfaces of the bottom electrodes, leaving behind a set of dielectric barriers between adjacent bottom electrodes.

12 Claims, 13 Drawing Sheets

(51) Int. Cl.

| | |
|---|---|
| ***H10B 51/10*** | (2023.01) |
| ***H10B 51/20*** | (2023.01) |
| ***H10B 53/10*** | (2023.01) |
| ***H10B 53/20*** | (2023.01) |
| ***H10B 53/30*** | (2023.01) |

(52) U.S. Cl.

CPC ............. *H10B 51/20* (2023.02); *H10B 53/10* (2023.02); *H10B 53/20* (2023.02); *H10B 53/30* (2023.02)

(56) References Cited

U.S. PATENT DOCUMENTS

| | | | | |
|---|---|---|---|---|
| 11,903,184 | B2 * | 2/2024 | Lee | H10B 12/33 |
| 2005/0170599 | A1 * | 8/2005 | Joo | H10D 1/716<br>257/E21.648 |
| 2015/0340367 | A1 * | 11/2015 | Manabe | H10B 12/34<br>257/334 |
| 2020/0006346 | A1 * | 1/2020 | Avci | H01L 23/5223 |
| 2020/0411520 | A1 * | 12/2020 | Lajoie | H10B 12/30 |

* cited by examiner

FERROELECTRIC MEMORY ARRAYS WITH LOW PERMITTIVITY DIELECTRIC BARRIERS

CROSS REFERENCE

The present application for patent claims the benefit of U.S. Provisional Patent Application No. 63/365,687 by Servalli et al., entitled "FERROELECTRIC MEMORY ARRAYS WITH LOW PERMITTIVITY DIELECTRIC BARRIERS," filed Jun. 1, 2022, assigned to the assignee hereof, and expressly incorporated by reference herein.

FIELD OF TECHNOLOGY

The following relates to one or more systems for memory, including ferroelectric memory arrays with low permittivity dielectric barriers.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source. FeRAM may be able to achieve densities similar to volatile memory but may have non-volatile properties due to the use of a ferroelectric capacitor as a storage device.

DETAILED DESCRIPTION

Some memory devices may include an array of capacitive memory cells arranged over an array of vertical transistors, such as thin film transistors (TFTs), configured to couple each memory cell with an access line, such as a digit line, as part of an access operation for the memory cell. In some cases, each memory cell may include a bottom electrode (e.g., a bottom plate of a capacitor for the memory cell) and a top electrode (e.g., a top plate for the capacitor), with a layer of ferroelectric material between the bottom electrode and top electrode. Accordingly, as part of an access operation, the memory device may be configured to bias the capacitor, for example by applying a voltage to the bottom electrode. However, applying a voltage to a bottom electrode of a memory cell may result in electrostatic coupling between the memory cell and adjacent memory cells of the memory array. For example, the manufacturing procedures used to manufacture the memory array may include depositing the ferroelectric material between respective bottom electrodes of adjacent memory cells. Accordingly, a capacitance between bottom electrodes of adjacent memory cells may result in undesirable coupling between the memory cells, which may disturb or destroy a logic state stored in a coupled memory cell. Thus, techniques to reduce capacitive coupling between adjacent memory cells are desired.

As described herein, a manufacturing process to manufacture a memory array may include depositing a dielectric barrier between respective bottom electrodes of a pair of adjacent memory cells. For example, the manufacturing process may include depositing a film of dielectric material over rows of bottom electrodes formed on a set of dielectric walls to at least partially fill space between adjacent bottom electrodes. Alternatively, the manufacturing process may include depositing a film of dielectric material into a set of cavities, each cavity having a set of bottom electrodes formed on sidewalls of the cavity. Subsequently, a portion of the dielectric material may be removed to expose surfaces of the bottom electrodes, leaving behind a set of dielectric barriers between adjacent bottom electrodes. In some cases, the material of the dielectric barriers may have a lower dielectric constant (e.g., a lower permittivity) than the ferroelectric material of the memory cells. Accordingly, the dielectric barriers may reduce the capacitance, and thus reduce capacitive coupling, between adjacent memory cells.

Figure 1:
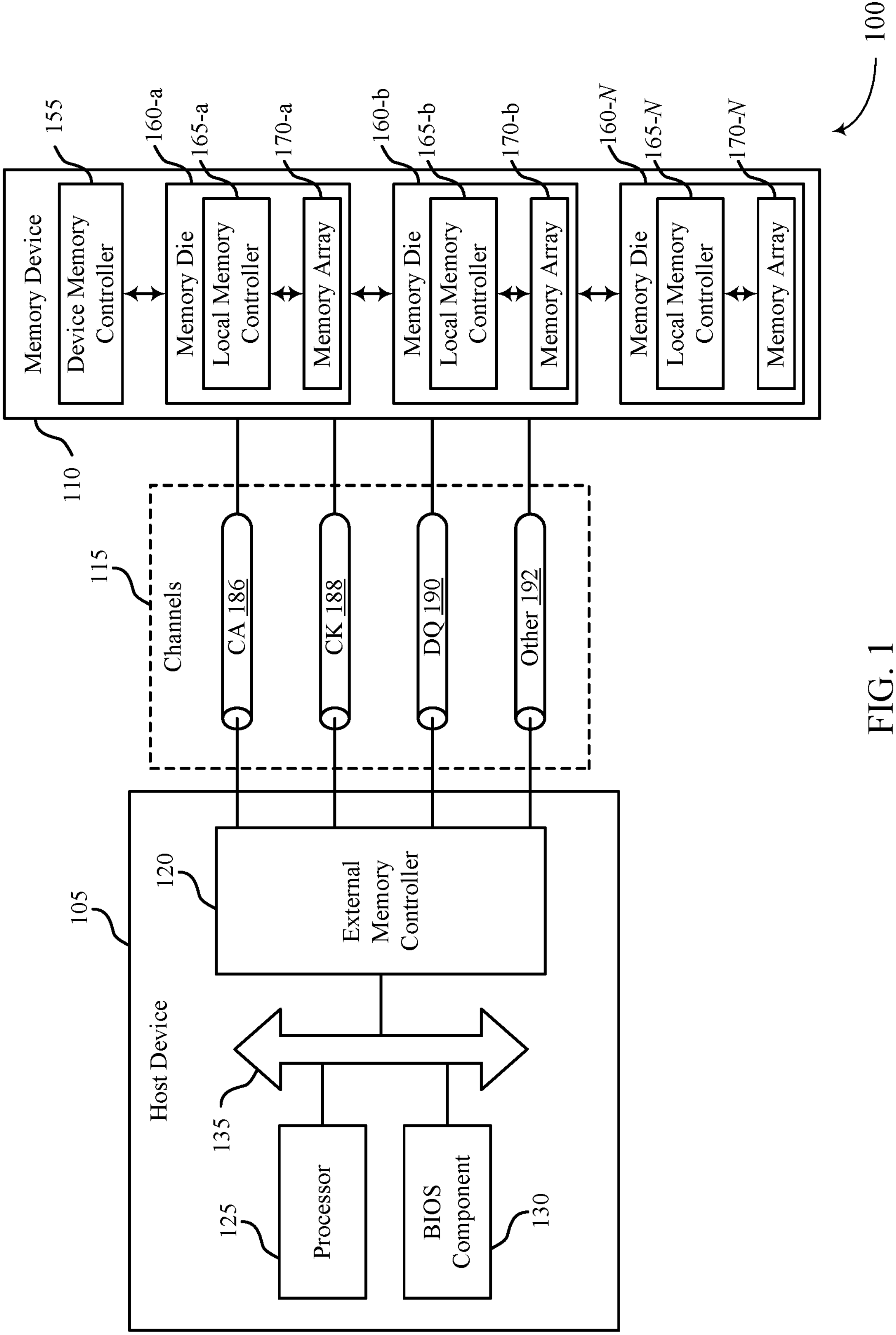
FIG. 1 illustrates an example of a system that supports ferroelectric memory arrays with low permittivity dielectric barriers in accordance with examples as disclosed herein.
Figure 2:
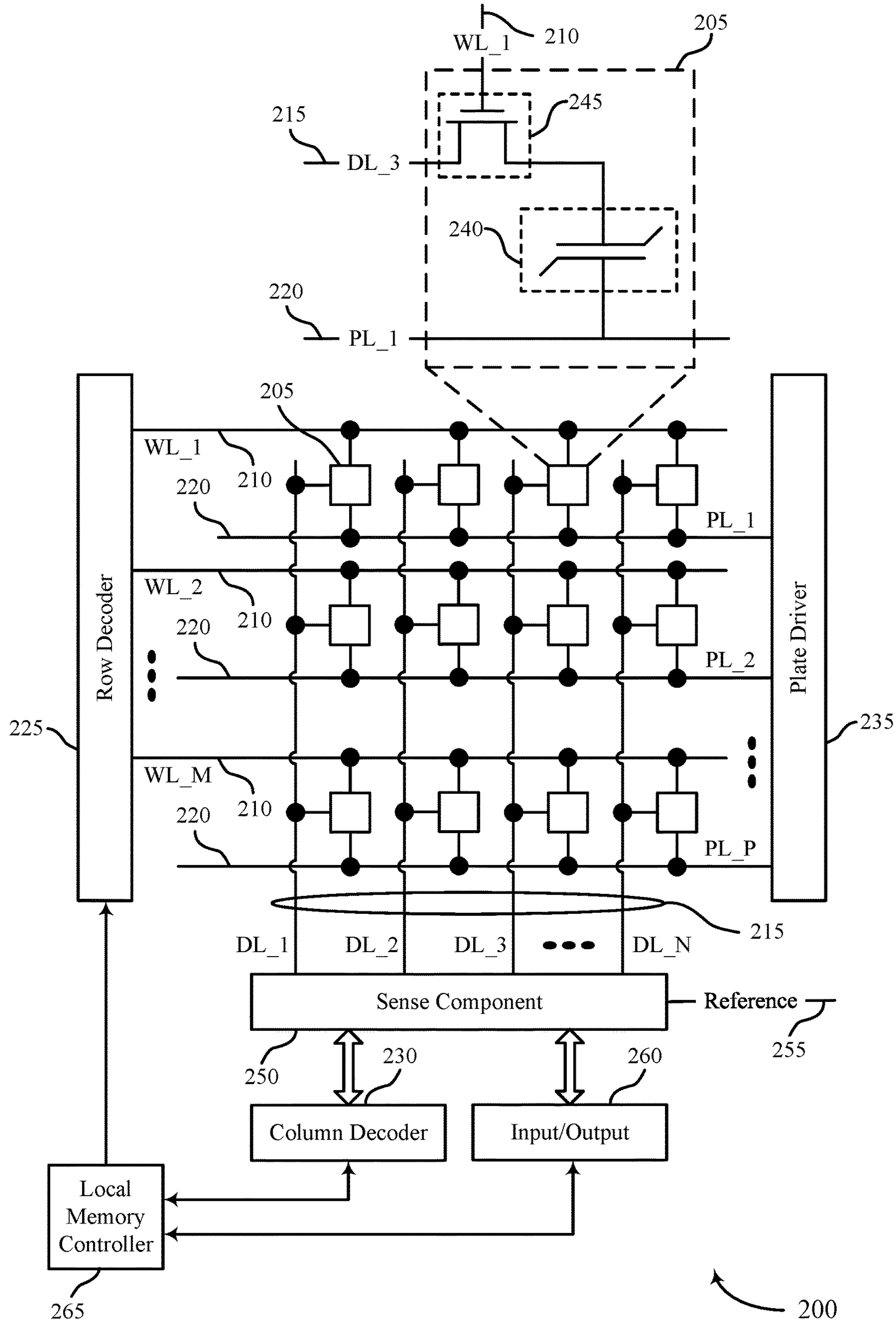
FIG. 2 illustrates an example of a memory die that supports ferroelectric memory arrays with low permittivity dielectric barriers in accordance with examples as disclosed herein.

Features of the disclosure are initially described in the context of systems and dies with reference to FIGS. 1 and 2. Features of the disclosure are described in the context of a memory array and manufacturing steps with reference to FIGS. 3 through 11. These and other features of the disclosure are further illustrated by and described with reference to an apparatus diagram and flowcharts that relate to ferroelectric memory arrays with low permittivity dielectric barriers as described with reference to FIGS. 12 through 13.

FIG. 1 illustrates an example of a system 100 that supports ferroelectric memory arrays with low permittivity dielectric barriers in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

A memory die 160 may be an example of a two-dimensional (2D) array of memory cells or may be an example of a three-dimensional (3D) array of memory cells. In some examples, a 2D memory die 160 may include a single memory array 170. In some examples, a 3D memory die 160 may include two or more memory arrays 170, which may be stacked on top of one another or positioned next to one another (e.g., relative to a substrate). In some examples, memory arrays 170 in a 3D memory die 160 may be referred to as or otherwise include different sets (e.g., decks, levels, layers, dies). A 3D memory die 160 may include any quantity of stacked memory arrays 170 (e.g., two high, three high, four high, five high, six high, seven high, eight high). In some 3D memory dies 160, different decks may share a common access line such that some decks may share one or more of a word line, a digit line, or a plate line.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some cases, a manufacturing process to manufacture a memory array 170 may include depositing a dielectric barrier between respective bottom electrodes of a pair of adjacent memory cells of the memory array 170. For example, the manufacturing process may include depositing a film of dielectric material over rows of bottom electrodes formed on a set of dielectric walls to at least partially fill space between adjacent bottom electrodes. Alternatively, the manufacturing process may include depositing a film of dielectric material into a set of cavities of the memory array 170, each cavity having a set of bottom electrodes formed on sidewalls of the cavity. Subsequently, a portion of the dielectric material may be removed to expose surfaces of the bottom electrodes, leaving behind a set of dielectric barriers between adjacent bottom electrodes. In some cases, the material of the dielectric barriers may have a lower dielectric constant (e.g., a lower permittivity) than the ferroelectric material of the memory cells. Accordingly, the dielectric barriers may reduce the capacitance, and thus reduce capacitive coupling, between adjacent memory cells.

FIG. 2 illustrates an example of a memory die 200 that supports ferroelectric memory arrays with low permittivity dielectric barriers in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a state (e.g., a polarization state, a dielectric charge) representative of the programmable states in a capacitor. The memory cell 205 may include a logic storage component, such as capacitor 240, and a switching component 245 (e.g., a cell selection component). A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. In FeRAM architectures, the memory cell 205 may include a capacitor 240 (e.g., a ferroelectric capacitor) that includes a ferroelectric material to store a charge (e.g., a polarization) representative of the programmable state.

The memory die 200 may include access lines (e.g., word lines 210, digit lines 215, plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding. Memory cells 205 may be positioned at intersections of the word lines 210, the digit lines 215, or the plate lines 220.

Operations such as reading and writing may be performed on memory cells 205 by activating access lines such as a word line 210, a digit line 215, or a plate line 220. By biasing a word line 210, a digit line 215, and a plate line 220 (e.g., applying a voltage to the word line 210, digit line 215, or plate line 220), a single memory cell 205 may be accessed at their intersection. The intersection of a word line 210 and a digit line 215 in a two-dimensional or in a three-dimensional configuration may be referred to as an address of a memory cell 205. Activating a word line 210, a digit line 215, or a plate line 220 may include applying a voltage to the respective line.

Accessing the memory cells 205 may be controlled through a row decoder 225, a column decoder 230, or a plate driver 235, or any combination thereof. For example, a row decoder 225 may receive a row address from the local memory controller 265 and activate a word line 210 based on the received row address. A column decoder 230 may receive a column address from the local memory controller 265 and activate a digit line 215 based on the received column address. A plate driver 235 may receive a plate address from the local memory controller 265 and activate a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that couples the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state, a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage, a reference line). The detected logic state of the memory cell 205 may be provided as an output of the sense component 250 (e.g., to an input/output 260), and may indicate the detected logic state to another component of a memory device (e.g., a memory device 110) that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 265 may generate row signals and column address signals to activate the target word line 210, the target digit line 215, and the target plate line 220. The local memory controller 265 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

In some cases, a manufacturing process to manufacture a memory die 200 may include depositing a dielectric barrier between respective bottom electrodes of a pair of adjacent capacitors 240 of memory cells 205 of the memory die 200. For example, the manufacturing process may include depositing a film of dielectric material over rows of bottom electrodes formed on a set of dielectric walls to at least partially fill space between adjacent bottom electrodes. Alternatively, the manufacturing process may include depositing a film of dielectric material into a set of cavities of the memory die 200, each cavity having a set of bottom electrodes formed on sidewalls of the cavity. Subsequently, a portion of the dielectric material may be removed to expose surfaces of the bottom electrodes, leaving behind a set of dielectric barriers between adjacent bottom electrodes. In some cases, the material of the dielectric barriers may have a lower dielectric constant (e.g., a lower permittivity) than the ferroelectric material of the memory cells. Accordingly, the dielectric barriers may reduce the capacitance, and thus reduce capacitive coupling, between adjacent memory cells 205.

Figure 3:
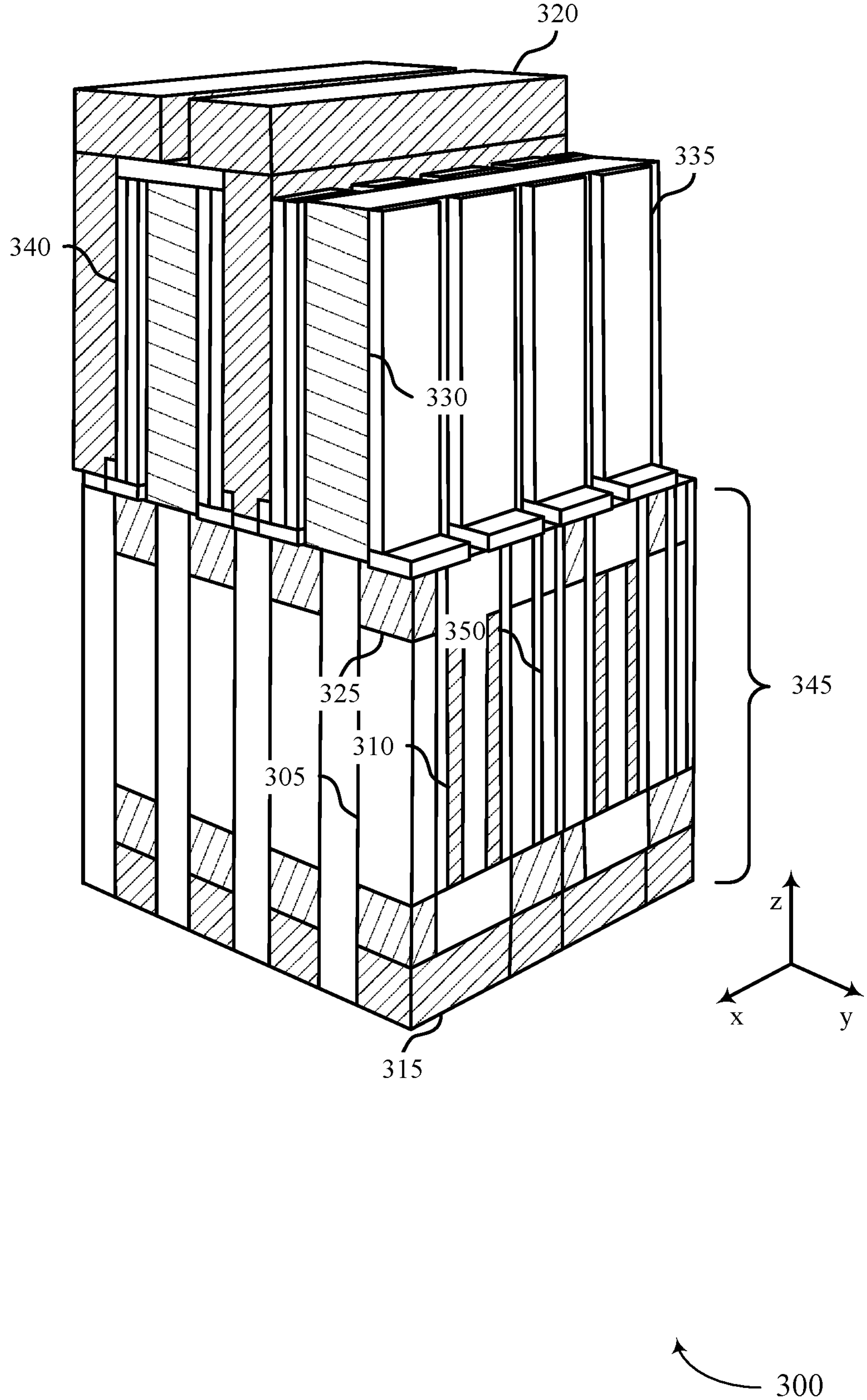
FIG. 3 illustrates an example of a memory array that supports ferroelectric memory arrays with low permittivity dielectric barriers in accordance with examples as disclosed herein.

FIG. 3 illustrates an example of a memory array 300 that supports ferroelectric memory arrays with low permittivity dielectric barriers in accordance with examples as disclosed herein. The memory array 300 may include a set of memory cells (e.g., capacitive memory cells 205 as described with reference to FIG. 2) formed along dielectric walls 330 extending in the x-direction. Each memory cell may include an electrode segment 335 (e.g., a bottom electrode plate) formed on a sidewall of a dielectric wall 330. The memory array 300 may include a set of plate lines extending in the x-direction over rows of electrode segments 335. A plate line may be configured as an upper electrode plate for a row of electrode segments 335, which may form a set of capacitors corresponding to the memory cells. In some cases, the memory array 300 may include a continuous layer of ferroelectric material 340 between the electrode segments 335 and the plate line 320. Each memory cell may be programmed to store one or more logic states by applying a voltage across a selected electrode segment 335 and a plate line 320, which may store charge (e.g., a polarization state, a dielectric charge) across the ferroelectric material 340.

The memory array 300 may further include an assembly 345 to support access operations for memory cells positioned on the assembly 345. The assembly 345 may include a set of digit lines 315 extending in the x-direction and a set of word lines 310 extending in the y-direction and configured to selectively couple a set of memory cells with a set of digit lines 315. The assembly 345 may further include a set of transistors 305 arranged in one or more rows extending in the x-direction and one or more columns extending in the y-direction. A transistor 305 may be operable to selectively couple an electrode segment 335 with a digit line 315. For example, a word line 310 may be configured to bias a gate of the transistor 305 to couple a source terminal and a drain terminal of the transistors 305. In some cases, each transistor 305 may include a contact 325 (e.g., a terminal, such as the source terminal or drain terminal) arranged on an upper surface of the assembly 345. In some cases, the assembly 345 may include a set of shield lines 350 (e.g., barrier lines) extending in the y-direction arranged between alternating columns of transistors 305. A shield line 350 may act as barrier between pairs of columns of transistors 305, which may mitigate undesirable effects on a first word line 310 if an adjacent second word line 310 is biased, such as a voltage of the second word line 310 activating a transistor 305 coupled with the first word line 310.

Although FIG. 3 depicts a height of the electrode segments 335 and dielectric wall 330 being similar to a height of the assembly 345, such a similarity may be included for illustrative clarity. In some cases, the height of the electrode segments 335 and dielectric wall 330 may be greater (e.g., substantially greater) than the height of the assembly 345, which may introduce mechanical stability concerns for the memory array 300. Accordingly, the memory array 300 may include various configurations of dielectric material (e.g., the dielectric walls 330 or dielectric cavities) to provide mechanical support to the electrode segments 335.

In some examples, adjacent electrode segments 335 may have an undesirable capacitance (e.g., parasitic capacitance). Accordingly, as part of an access operation for a first electrode segment 335 of a first memory cells, a second electrode segment 335 of a second memory cell may develop a voltage due to the parasitic capacitance, which may disturb or destroy a logic state stored by the second memory cell. In order to mitigate the parasitic capacitance, the memory array 300 may include a set of dielectric barriers between adjacent electrode segments 335. The dielectric barriers may have a low dielectric constant (e.g., a low permittivity) relative to other components of the memory array 300, such as the ferroelectric material 340. Accordingly, the dielectric barriers may reduce the capacitance, and thus reduce capacitive coupling, between electrode segments 335 of adjacent memory cells.

FIGS. 4 through 11 illustrate examples of operations that support ferroelectric memory arrays with low permittivity dielectric barriers in accordance with examples as disclosed herein. For example, FIGS. 4 through 11 may illustrate aspects of a sequence of operations for fabricating aspects of a memory array, which may be a portion of a memory device (e.g., a portion of a memory device 110, a portion of a memory die 200, a memory array 300). Each view of the figures may be described with reference to an x-direction, a y-direction, and a z-direction, as illustrated. The provided figures may include section views that illustrate example cross-sections of the memory array. For example, in FIGS. 4 through 11, a view "SECTION A-A" may be associated with a cross-section in an xz-plane (e.g., in accordance with a cut plane A-A), and a view "SECTION B-B" may be associated with a cross-section in an yz-plane (e.g., in accordance with a cut plane B-B). Additionally, a top view may be associated with a cross-section in an xy-plane cutting the memory array at mid-height (e.g., a plane located at an approximate middle of the memory array in the z-direction). Although the memory array illustrates examples of certain relative dimensions and quantities of various features, aspects of the memory array may be implemented with other relative dimensions or quantities of such features in accordance with examples as disclosed herein.

Operations illustrated in and described with reference to FIGS. 4 through 11 may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

Figure 4:
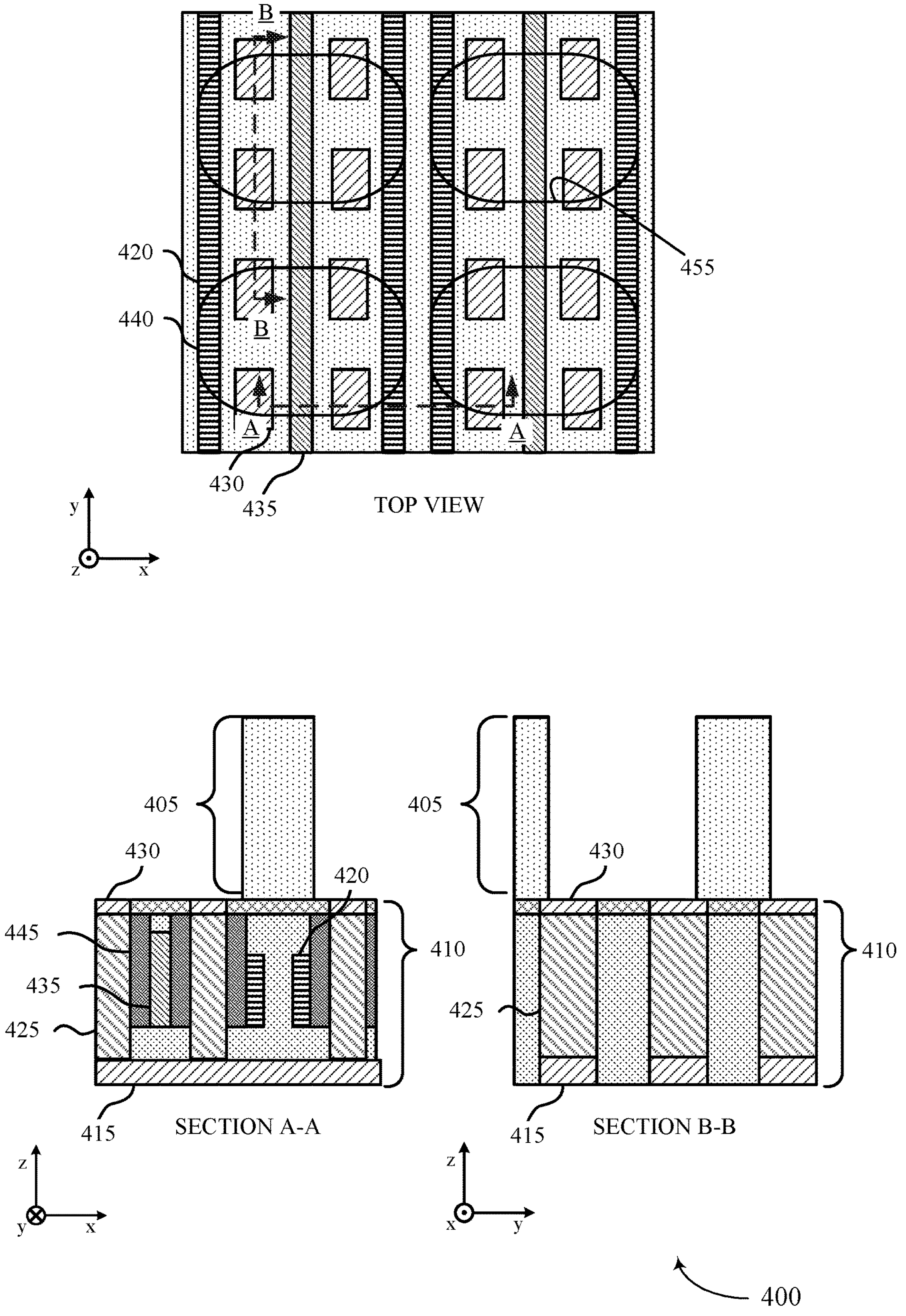
FIG. 4 illustrates an example of a memory array that supports ferroelectric memory arrays with low permittivity dielectric barriers in accordance with examples as disclosed herein.

FIG. 4 illustrates an example of a memory array 400 after a first set of manufacturing operations that support ferroelectric memory arrays with low permittivity dielectric barriers in accordance with examples as disclosed herein. The first set of manufacturing operations may include depositing a layer of dielectric material 405 above an assembly 410. The assembly 410 may include circuitry used as part of accessing memory cells of a memory array, such as the memory array 170. For example, the assembly 410 may include one or more digit lines 415 extending in the x-direction and one or more word lines 420 extending in the y-direction, which may each be examples of the corresponding components as described with reference to FIG. 2. It should be noted that the top view of memory array 400 shown in FIG. 4 shows the dielectric material 405 as transparent to illustrate the portions of the assembly 410 below.

The assembly 410 may include a set of transistors 425 arranged in one or more rows extending in the x-direction and one or more columns extending in the y-direction. A transistor 425 may be operable to selectively couple a memory cell with a digit line 415. For example, a word line 420 may be configured to bias a gate of the transistor 425 to couple a source terminal and a drain terminal of the transistors 425. In some cases, each transistor 425 may include a contact 430 (e.g., a terminal, such as the source terminal or drain terminal) arranged on an upper surface of the assembly 410. In some cases, the assembly 410 may include a set of shield lines 435 (e.g., barrier lines) extending in the y-direction arranged between alternating columns of transistors 425 (e.g., as illustrated in FIG. 4). A shield line 435 may act as barrier between pairs of columns of transistors 425, which may mitigate undesirable effects (e.g., parasitic capacitance) on a first word line 420 if an adjacent second word line 420 is biased. In some cases, the assembly 410 may include an insulative or liner material 445, which may act as a barrier for a transistor 425.

The first set of manufacturing operations may also include operations that support removing one or more portions of the layer of dielectric material 405 to form a set of cavities 440. For example, the first set of manufacturing operations may include etching (e.g., dry etching) the layer of dielectric material 405 to form the set of cavities 440. In some cases, the set of cavities 440 may be arranged in a grid structure, which may include one or more rows extending in the x-direction and one or more columns extending the y-direction. A cavity 440 may be associated with and expose a set of contacts 430. For example, forming a cavity 440 may expose four contacts 430. Each cavity may have an interior wall 455.

Additionally or alternatively, the first set of manufacturing operations may include removing one or more portions of the dielectric material to form a set of dielectric walls extending in a horizontal direction (e.g., the x-direction or the y-direction). For example, the first set of manufacturing operations may include etching the layer of dielectric material 405 to form one or more trenches extending in the horizontal direction, and the remaining portions of the dielectric material 405 may form the dielectric walls. In some cases, forming the one or more trenches may expose one or more rows or one or more columns of the contacts 430.

Figure 5:
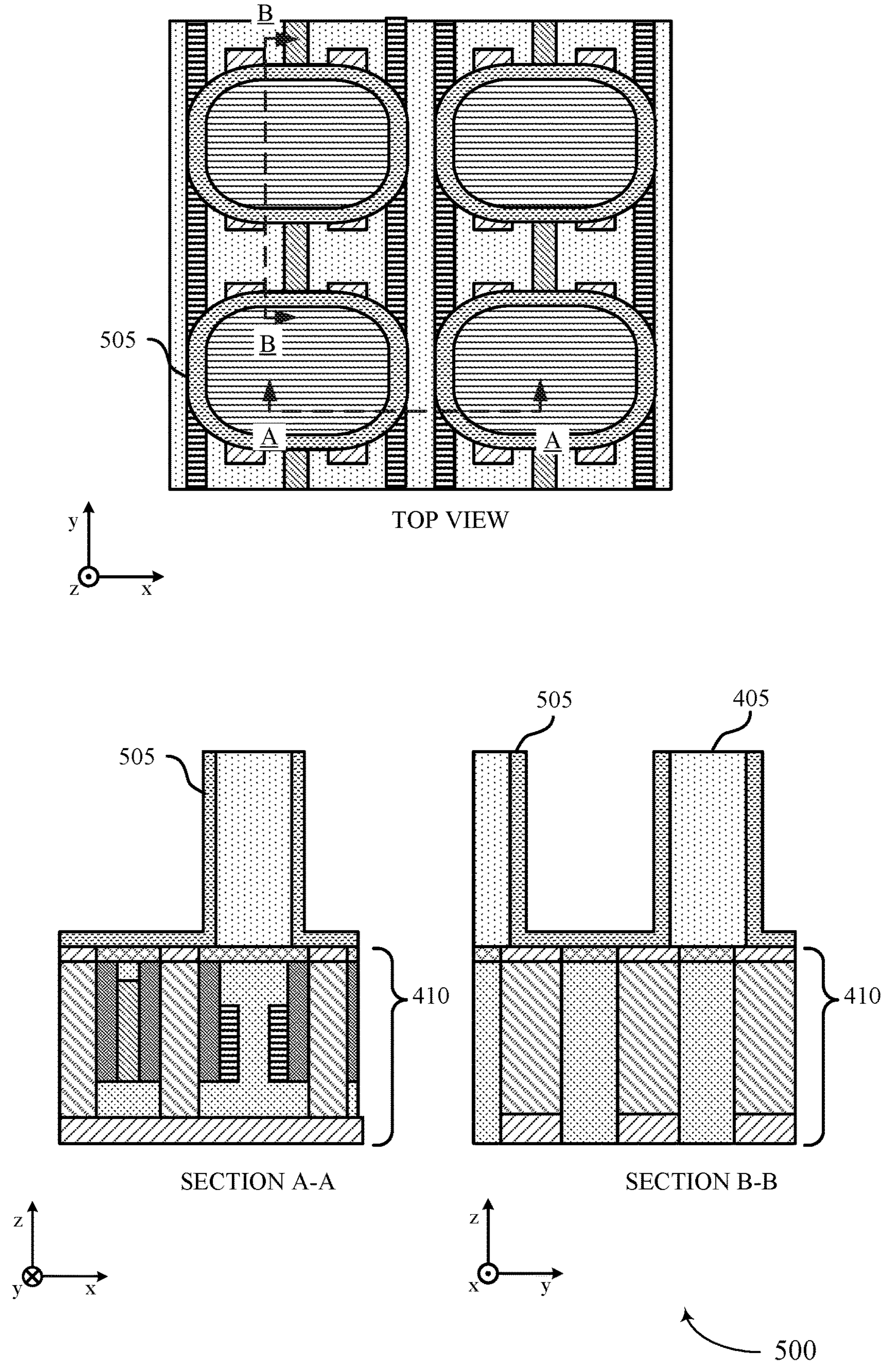
FIG. 5 illustrates an example of a memory array that supports ferroelectric memory arrays with low permittivity dielectric barriers in accordance with examples as disclosed herein.

FIG. 5 illustrates an example of a memory array 500 after a second set of manufacturing operations that support ferroelectric memory arrays with low permittivity dielectric barriers in accordance with examples as disclosed herein. The second set of manufacturing operations may include depositing a layer of electrode material 505 onto the layer of dielectric material 405. In some cases, the electrode material may be an example of a conductive material. It should be noted that the top view of memory array 500 shown in FIG. 5 shows the dielectric material 405 as transparent to illustrate the portions of the assembly 410 below.

For example, the second set of manufacturing operations may include depositing the layer of electrode material 505 into each cavity 440. Accordingly, the layer of electrode material 505 may cover sidewalls of each cavity 440, and may cover the exposed surface of the assembly 410. That is, the layer of electrode material 505 may be deposited to be coupled with the exposed contacts 430 of each cavity 440. In some cases, the portion of the layer of electrode material 505 in contact with the assembly 410 may be referred to as a lower surface of the layer of electrode material 505. Additionally or alternatively, the layer of electrode material 505 may be deposited to cover sidewalls of the dielectric walls. Further, the layer of electrode material may be deposited to be coupled with contacts 430 exposed by trenches corresponding to the dielectric walls.

In some cases, depositing the layer of electrode material 505 may cover exposed portions of the top of the layer of dielectric material 405. For example, the layer of electrode material 505 may be deposited to cover portions of the layer of dielectric material 405 between cavities 440 or to cover an upper surface of a dielectric wall. Accordingly, the second set of manufacturing operations may include removing the portion of the layer of electrode material 505 covering the portions of the layer of dielectric material 405 between cavities 440 or the upper surface of a dielectric wall. Thus, a layer of electrode material 505 corresponding to a first cavity 440 may be isolated (e.g., electrically) from a layer of electrode material 505 corresponding to a second cavity 440. Alternatively, a layer of electrode material 505 corresponding to a first sidewall of a dielectric wall may be isolated (e.g., electrically) from a layer of electrode material 505 corresponding to a second sidewall of the dielectric wall.

Figure 6:
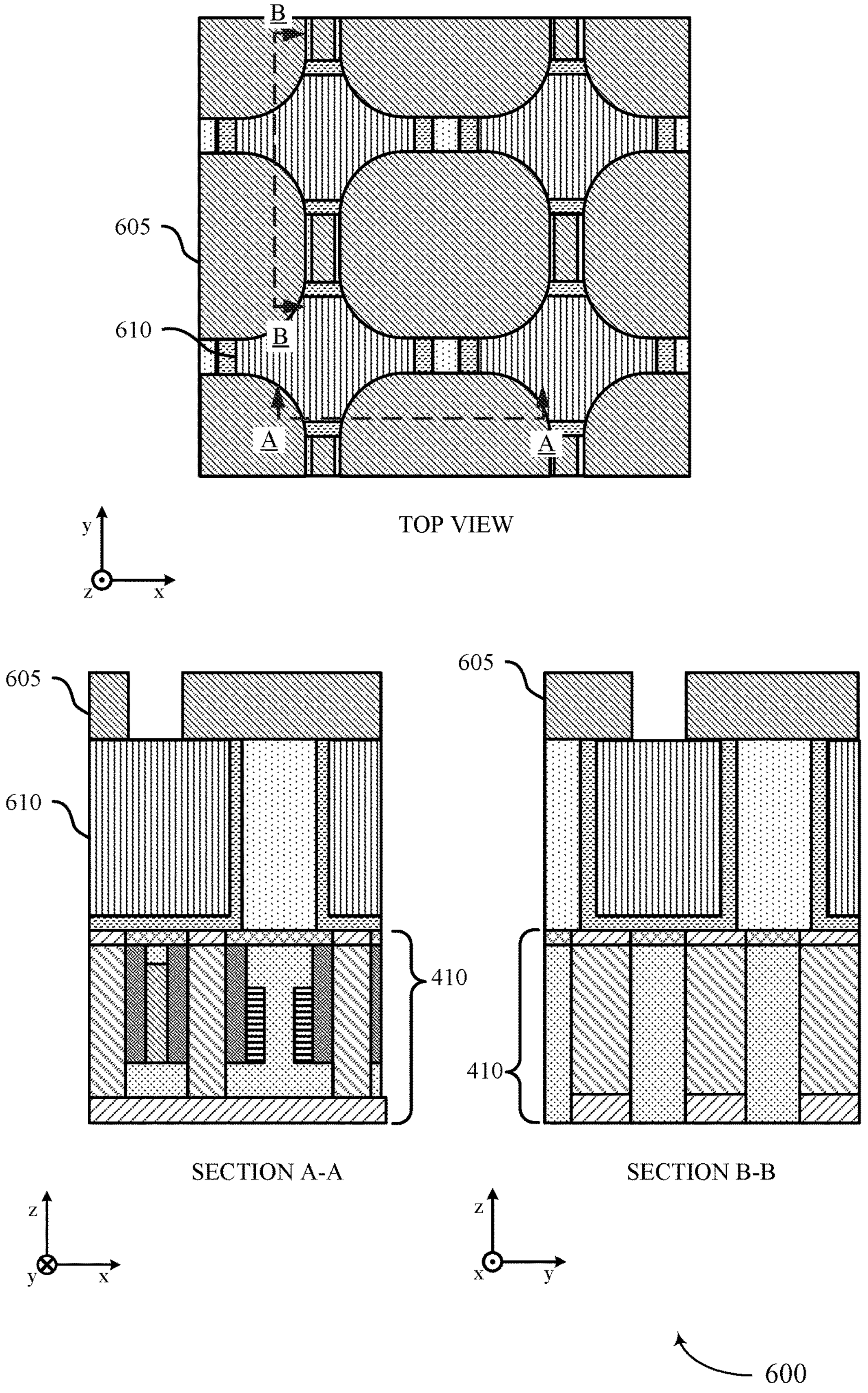
FIG. 6 illustrates an example of a memory array that supports ferroelectric memory arrays with low permittivity dielectric barriers in accordance with examples as disclosed herein.

FIG. 6 illustrates an example of an operation of a memory array 600 after a third set of manufacturing operations that support ferroelectric memory arrays with low permittivity dielectric barriers in accordance with examples as disclosed herein. The third set of manufacturing operations may include depositing a mask layer 605 (e.g., a hard mask) onto the layer of dielectric material 405 and the layer of electrode material 505. In some cases, the mask layer 605 may be an example of a polysilicon hard mask.

For example, the third set of manufacturing operations may include depositing a set of portions of the mask layer 605 on to the layer of dielectric material 405. In some cases, the mask layer 605 may include a set of isolated portions arranged in one or more rows extending in the x-direction and one or more columns extending in the y-direction. Each portion of the mask layer 605 may be offset in the x-direction and y-direction from a respective cavity 440 (e.g., as depicted in FIG. 6). Accordingly each portion may cover a portion of a subset of the cavities 440. For example, each portion may cover a corner of four separate cavities 440. In some cases, a distance between adjacent portions of the mask layer 605 in the x-direction may be substantially equal to a distance between adjacent portions in the y-direction.

In some cases, the third set of manufacturing operations may include depositing a placeholder material 610 prior to depositing the mask layer 605. For example, the placeholder material 610 may be deposited to fill each cavity 440. In some cases, after depositing the placeholder material 610, the third set of manufacturing operations may include performing a planarization or etch-back procedure to remove a portion of the placeholder material 610. In some cases, the placeholder material 610 may include carbon.

Additionally or alternatively, the mask layer 605 may include a continuous layer of hard mask material which may include a set cavities offset from the cavities 440 in the x-direction and the y-direction. In such cases, each cavity of the mask layer 605 may expose a portion of a subset of the cavities 440. For example, each cavity of the mask layer 605 may expose a corner of four separate cavities 440.

Figure 7:
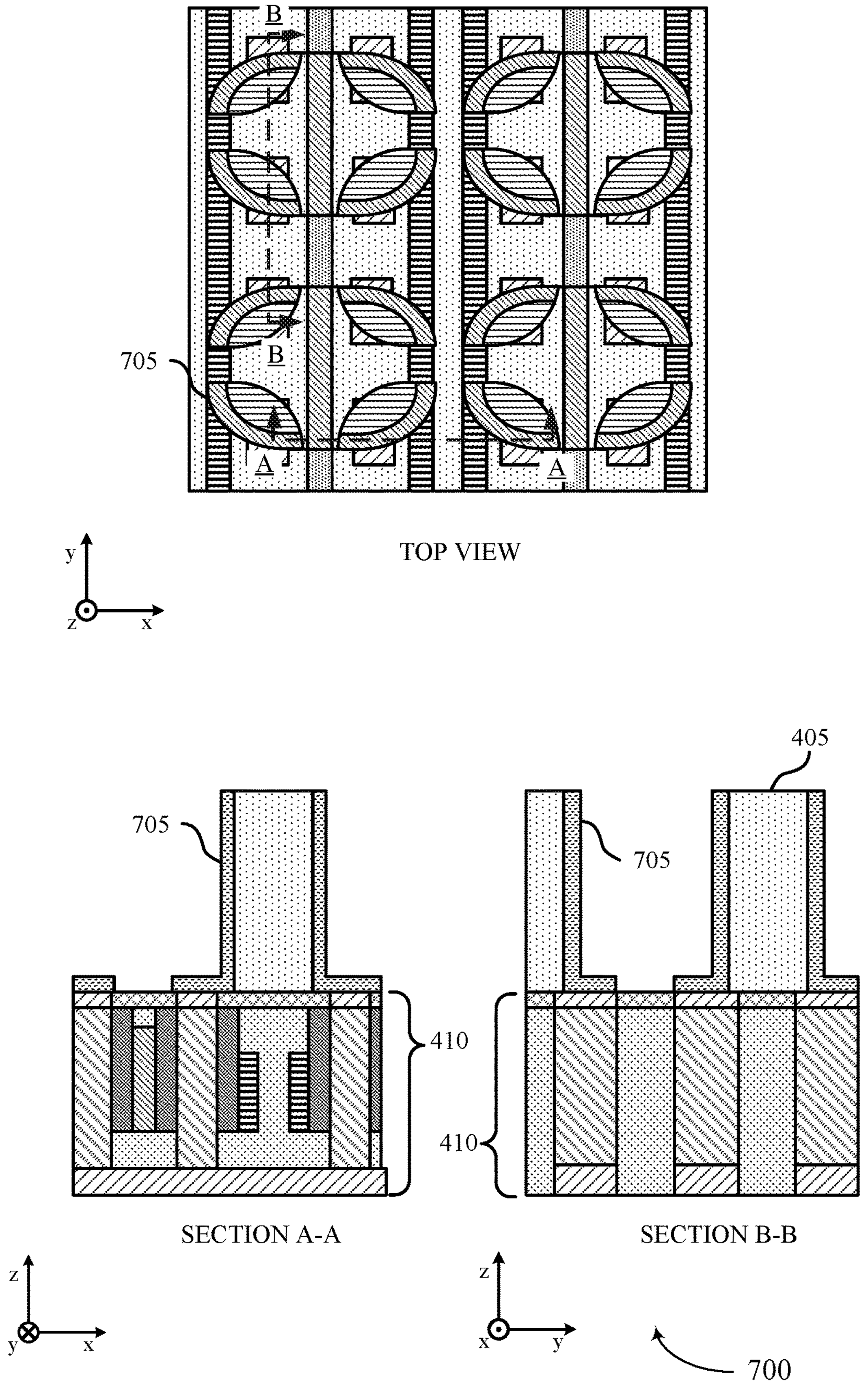
FIG. 7 illustrates an example of a memory array that supports ferroelectric memory arrays with low permittivity dielectric barriers in accordance with examples as disclosed herein.

FIG. 7 illustrates an example of a memory array 700 after a fourth set of manufacturing operations that support ferroelectric memory arrays with low permittivity dielectric barriers in accordance with examples as disclosed herein. The fourth set of manufacturing operations may include removing at least a portion of the layer of electrode material 505 in each cavity 440 to form a set of electrode segments 705. It should be noted that the top view of memory array 700 shown in FIG. 7 shows the dielectric material 405 as transparent to illustrate the portions of the assembly 410 below.

For example, the fourth set of manufacturing operations may include operations that support etching portions of the layer of electrode material 505 exposed by the mask layer 605. In some cases, etching the portions of the layer of electrode material 505 exposed by the mask layer 605 in each cavity 440 may separate the corresponding layer of electrode material 505 into a set of electrode segments 705. Each electrode segments 705 may correspond to a contact 430. Accordingly, a bottom surface of each electrode segment 705 may be coupled with a respective contact 430. In some examples, to remove the portions of the layer of electrode material 505, the fourth set of manufacturing operations may include a wet etching or atomic layer etching (ALE) procedure.

In some cases, the fourth set of manufacturing operations may further include removing the placeholder material 610. For example, after separating the layer of electrode material 505 into the electrode segments 705, the mask layer 605 may be removed, and the placeholder material 610 may be removed, for example using a selective etching procedure, such as a carbon stripping operation.

In some cases, such as if the memory array 700 includes the dielectric walls, the fourth set of manufacturing operations may include depositing a placeholder material, such as a nitride material, between dielectric walls to at least partially fill the corresponding trenches. Subsequently, the fourth set of manufacturing operations may include performing an etching procedure to separate the layer of electrode material covering sidewalls of the dielectric walls into a set of electrode segments 705. Each electrode segment 705 may correspond to a contact 430, and may include a sidewall covering a portion of a dielectric wall and a bottom surface coupled with the contact 430.

Figure 8:
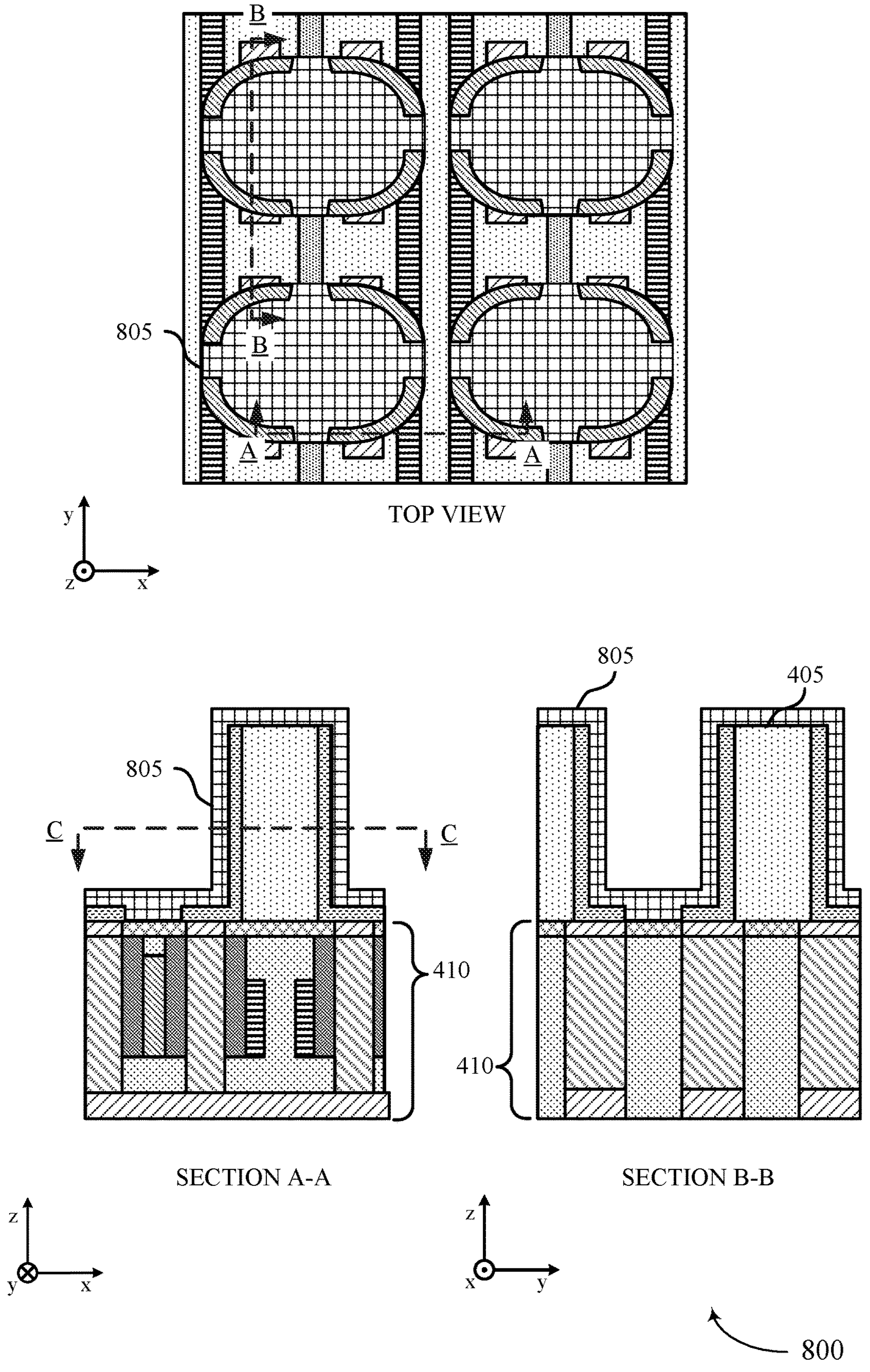
FIG. 8 illustrates an example of a memory array that supports ferroelectric memory arrays with low permittivity dielectric barriers in accordance with examples as disclosed herein.

FIG. 8 illustrates an example of a memory array 800 after a fifth set of manufacturing operations that support ferroelectric memory arrays with low permittivity dielectric barriers in accordance with examples as disclosed herein. The fifth set of manufacturing operations may include depositing a second layer of dielectric material 805 on to the memory array 800. In some cases, the second layer of dielectric material 805 may include a different dielectric material than the first layer of dielectric material 405. It should be noted that the top view of memory array 800 shown in FIG. 8 may show a top view along an intermediate section (e.g., section C-C), and shows the dielectric material 405 as transparent to illustrate the portions of the assembly 410 below.

For example, after separating the layer of electrode material 505 into the electrode segments 705, the fifth set of manufacturing operations may include depositing the second layer of dielectric material 805 into each cavity 440 to cover the electrode segments 705 and exposed portions of the assembly 410. Additionally or alternatively, the fifth set of manufacturing operations may include depositing the second layer of dielectric material 805 between dielectric walls to cover the associated electrode segments 705. In some cases, to deposit the second layer of dielectric material 805, the fifth set of manufacturing operations may support an atomic layer deposition (ALD) operation.

The second layer of dielectric material 805 may at least partially fill the space between the electrode segments formed as part of separating the layer of electrode material 505. For example, the second layer of dielectric material may extend from a sidewall of a first electrode segment 705 to a sidewall of an adjacent second electrode segment 705.

Figure 9:
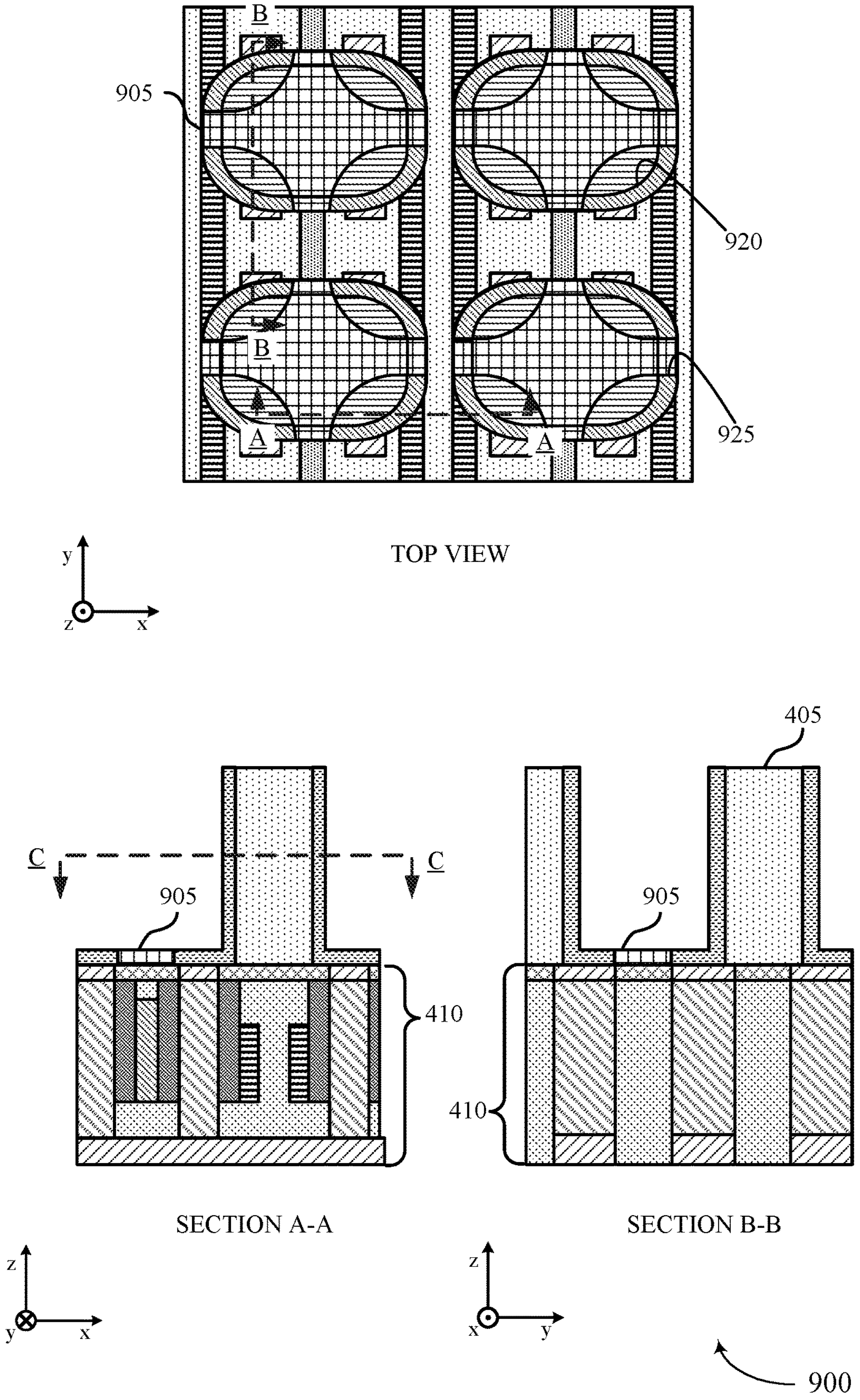
FIG. 9 illustrates an example of a memory array that supports ferroelectric memory arrays with low permittivity dielectric barriers in accordance with examples as disclosed herein.

FIG. 9 illustrates an example of a memory array 900 after a sixth set of manufacturing operations that support ferroelectric memory arrays with low permittivity dielectric barriers in accordance with examples as disclosed herein. The sixth set of manufacturing operations may include removing at least a portion of the second layer of dielectric material 805 in each cavity 440 to form a set of dielectric barriers or dielectric segments 905. It should be noted that the top view of memory array 900 shown in FIG. 9 may show a top view along an intermediate section (e.g., section C-C), and shows the dielectric material 405 as transparent to illustrate the portions of the assembly 410 below.

For example, the sixth set of manufacturing operations may include operations that support etching portions of the second layer of dielectric material 805 using a selective etching procedure, such as ALE or wet etching. In some cases, etching the portions of the second layer of the dielectric material 805 may expose surfaces of the electrode segments 705, such as surfaces 920 facing the interior of a cavity 440 (e.g., surfaces of the electrode segment 705 opposing a surface of the electrode segment 705 that is adjacent to an associated dielectric wall), while retaining other portions of the second layer of dielectric material 805 to form the dielectric segments 905. Accordingly the dielectric segments 905 may extend between a sidewall 925 of a first electrode segment 705 to a sidewall 925 of an adjacent second electrode segment 705. Dielectric segments 905 may at least partially fill a gap between sidewalls of adjacent electrode segments 705. For example, as part of etching portions of the second layer of dielectric material 805, a portion of the second dielectric material between the sidewalls of the electrode segments 705 may be removed (e.g., leaving a concave or convex surface of the dielectric material 805).

In some cases, removing the portion of the second layer of dielectric material 805 to form the dielectric segments 905 may leave at least a portion of the assembly 410 covered, as depicted in FIG. 9. Additionally or alternatively, removing the portion of the second layer of dielectric material 805 to form the dielectric segments 905 may expose at least a portion of the assembly 410.

The dielectric segments 905 may be act as a barrier between electrode segments 705 during operation of a memory array. For example, then dielectric segments 905 may have a relatively low permittivity (e.g., relative to other components of the memory array, such as a ferroelectric material as described in greater detail with reference to FIG. 10), which may mitigate unwanted coupling between adjacent electrode segments 705. For example, the dielectric segments 905 may reduce parasitic capacitance between adjacent electrode segments 705, which may reduce effects such as a disturbance of a memory state stored in a first memory cell resulting from capacitive coupling between the first memory cell and a proximate second memory cell if the second memory cell is accessed.

Figure 10:
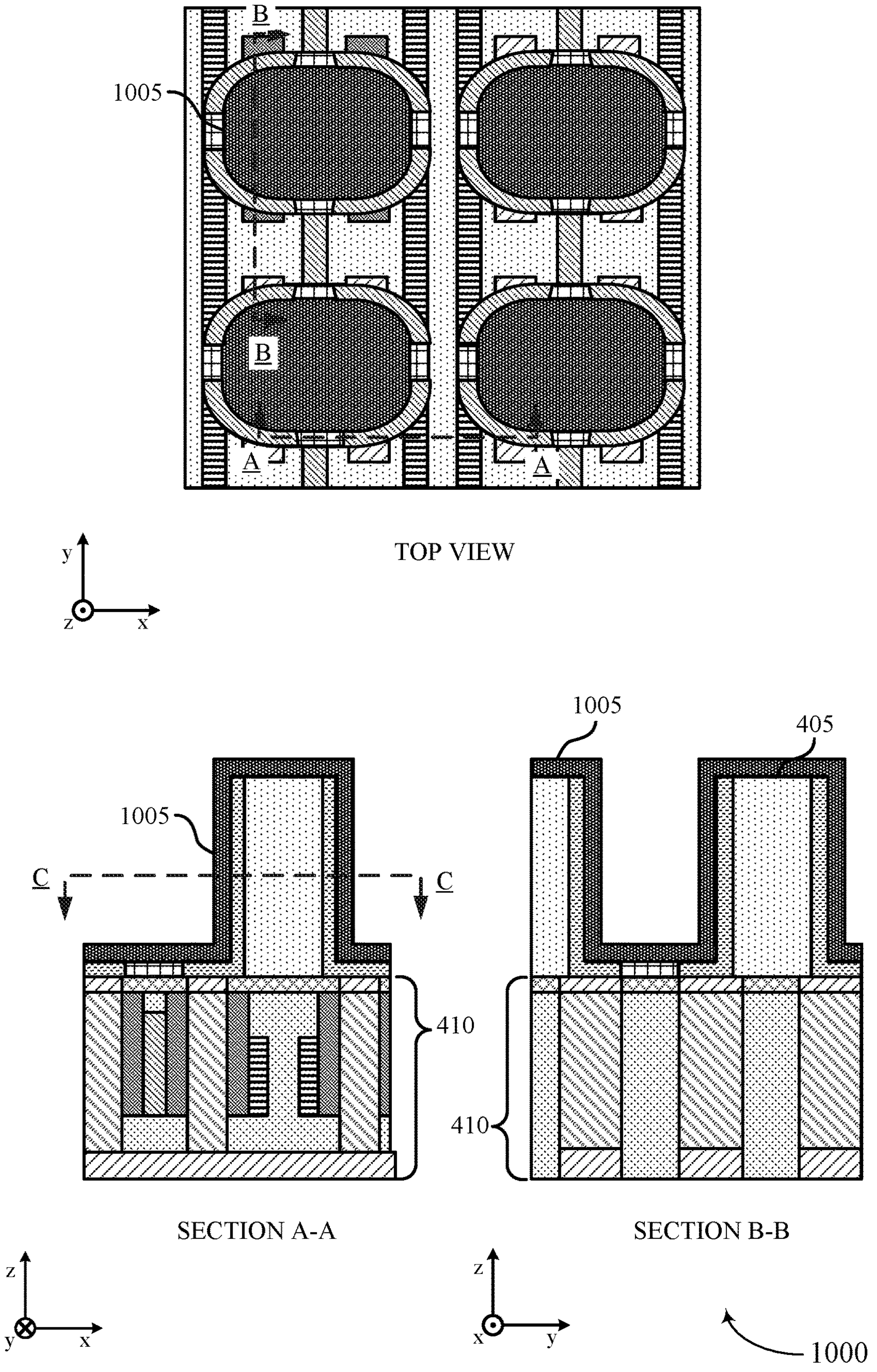
FIG. 10 illustrates an example of a memory array that supports ferroelectric memory arrays with low permittivity dielectric barriers in accordance with examples as disclosed herein.

FIG. 10 illustrates an example of a memory array 1000 after a seventh set of manufacturing operations that support ferroelectric memory arrays with low permittivity dielectric barriers in accordance with examples as disclosed herein. The seventh set of manufacturing operations may include depositing a layer of ferroelectric material 1005 on to the memory array 1000. It should be noted that the top view of memory array 1000 shown in FIG. 10 may show a top view along an intermediate section (e.g., section C-C), and shows the dielectric material 405 as transparent to illustrate the portions of the assembly 410 below.

For example, after forming the dielectric segments 905, the seventh set of manufacturing operations may include depositing the layer of ferroelectric material 1005 into each cavity 440 to cover the electrode segments 705 and each dielectric segment 905, and in some cases exposed portions of the assembly 410. Additionally or alternatively, the seventh set of manufacturing operations may include depositing the layer of ferroelectric material 1005 between dielectric walls to cover the associated electrode segments 705. In some cases, to deposit the layer of ferroelectric material 1005, the seventh set of manufacturing operations may support a film deposition operation.

Figure 11:
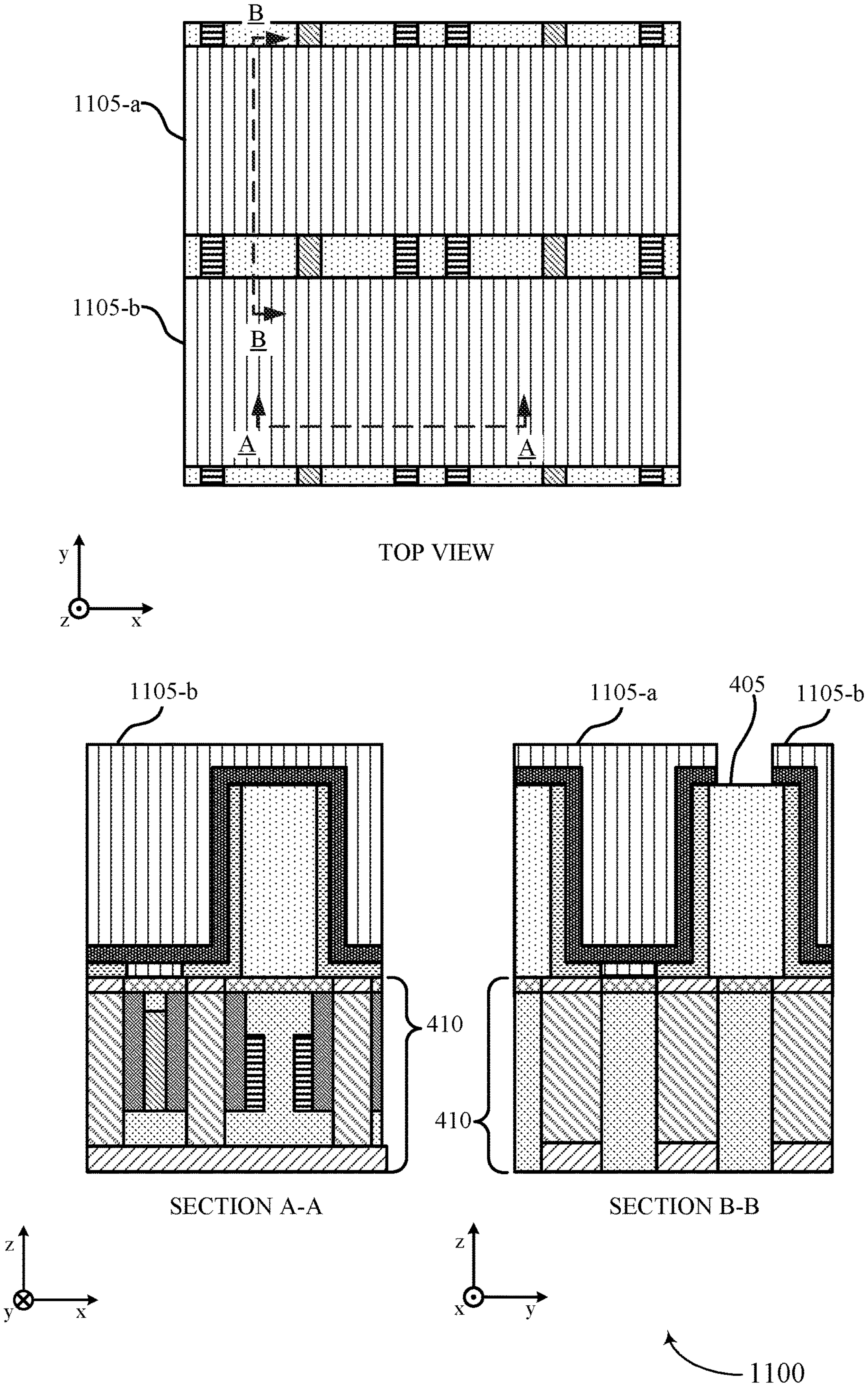
FIG. 11 illustrates an example of a memory array that supports ferroelectric memory arrays with low permittivity dielectric barriers in accordance with examples as disclosed herein.

FIG. 11 illustrates an example of a memory array 1100 after an eighth set of manufacturing operations that support ferroelectric memory arrays with low permittivity dielectric barriers in accordance with examples as disclosed herein. The eighth set of manufacturing operations may include depositing a layer of conductive material to form a set of plate lines 1105. It should be noted that the top view of memory array 1100 shown in FIG. 11 shows the dielectric material 405 as transparent to illustrate the portions of the assembly 410 below.

For example, after depositing the layer of ferroelectric material 1005, the eighth set of manufacturing operations may include depositing the conductive material into each cavity 440 to cover the layer of ferroelectric material 1005 and substantially fill the cavity 440. In some examples, the portion of the conductive material filling a cavity 440 may be referred to as a conductive post. Additionally or alternatively, the eighth set of manufacturing operations may include depositing the conductive material between and on top of dielectric walls to cover the layer of ferroelectric material 1005. In some cases, to deposit the conductive material, the eighth set of manufacturing operations may support a film deposition operation.

In some cases, the eighth set of manufacturing operations may include removing a portion of the conductive material, such as portion extending in x-direction (e.g., orthogonal to the word lines 420) between adjacent rows of cavities 440, to form a set of plate lines 1105. The set of plate lines 1105 may include a first plate line 1105-*a* corresponding to a first row of cavities 440 and a second plate line 1105-*b* corresponding to a second row of cavities 440. Accordingly, forming the set of plate lines 1105 may form a set of memory cells of the memory array 1100, each memory cell associated with a ferroelectric capacitor that includes an electrode segment 705 (e.g., a first plate of the capacitor) and a portion of a plate line 1105 (e.g., a second plate of the capacitor).

In some cases, a dielectric constant (e.g., a permittivity) of the layer of ferroelectric material 1005 may be greater than the dielectric constant of the material of the dielectric segments 905. Accordingly, a capacitance between an electrode segment 705 and an adjacent electrode segment 705 having a dielectric segment 905 between the electrode segment 705 and the adjacent electrode segment 705 may be less than a capacitance between the electrode segment 705 and the adjacent electrode segment 705 having a portion of the layer of ferroelectric material 1005 between the electrode segment 705 and the adjacent electrode segment 705. Thus, the dielectric segments 905 may reduce parasitic capacitance between adjacent electrode segments 705, which may reduce effects such as a disturbance of a memory state stored in a first memory cell resulting from capacitive coupling between the first memory cell and a proximate second memory cell if the second memory cell is accessed.

Figure 12:
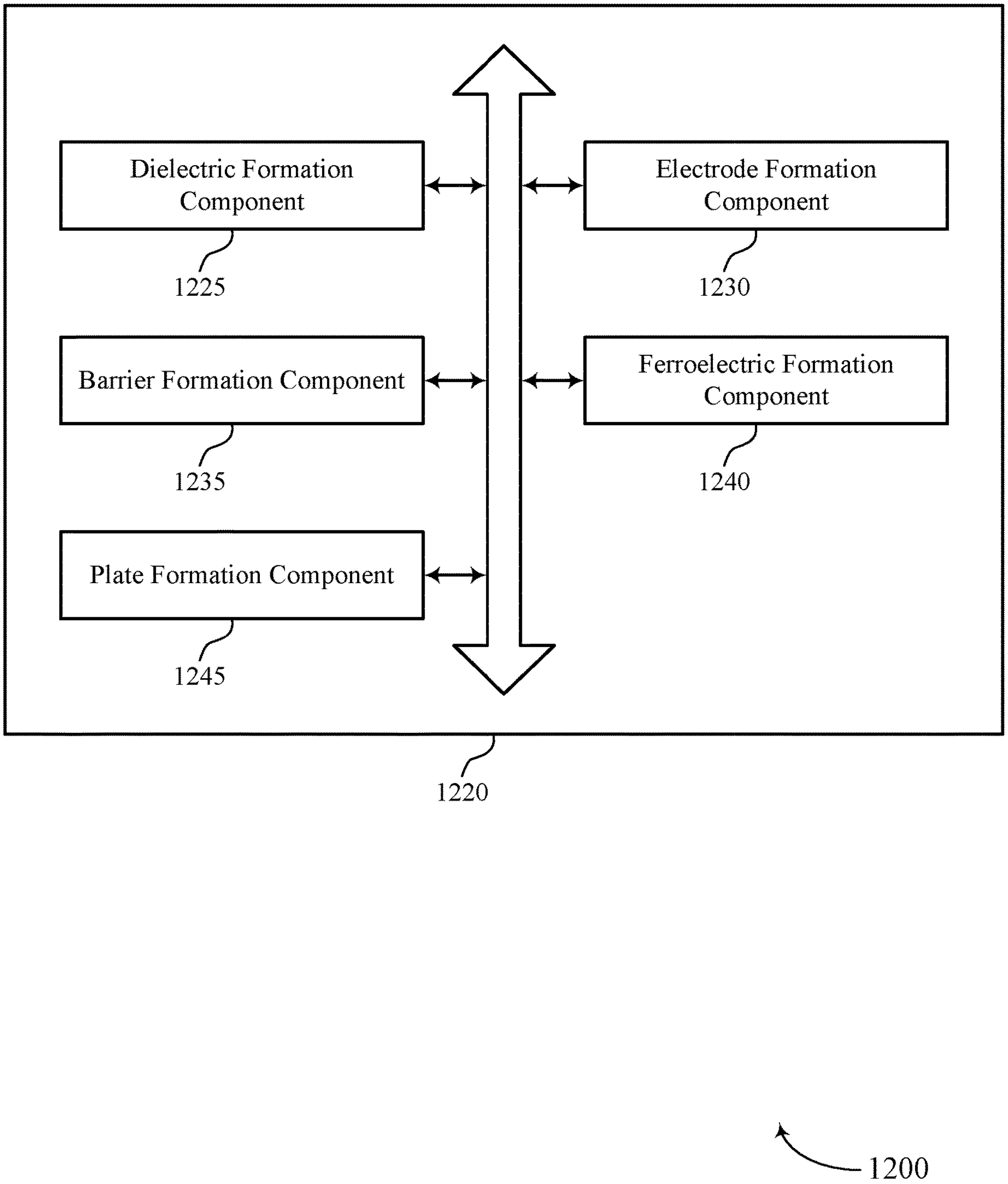
FIG. 12 shows a block diagram of a processing controller that supports ferroelectric memory arrays with low permittivity dielectric barriers in accordance with examples as disclosed herein.

FIG. 12 shows a block diagram 1200 of a processing controller 1220 that supports ferroelectric memory arrays with low permittivity dielectric barriers in accordance with examples as disclosed herein. The processing controller 1220 may be an example of aspects of a processing controller as described with reference to FIGS. 1 through 11. The processing controller 1220, or various components thereof, may be an example of means for performing various aspects of ferroelectric memory arrays with low permittivity dielectric barriers as described herein. For example, the processing controller 1220 may include a dielectric formation component 1225, an electrode formation component 1230, a barrier formation component 1235, a ferroelectric formation component 1240, a plate formation component 1245, or any combination thereof. Each of these components may communicate, directly or indirectly, with one another (e.g., via one or more buses).

The dielectric formation component 1225 may be configured as or otherwise support a means for forming a dielectric layer having a plurality of surfaces. The electrode formation component 1230 may be configured as or otherwise support a means for forming a plurality of electrode segments based at least in part on forming the dielectric layer, each electrode segment of the plurality of electrode segments having one or more sidewalls that oppose sidewalls of adjacent electrode segments of the plurality of electrode segments. The barrier formation component 1235 may be configured as or otherwise support a means for forming a plurality of barrier segments, each barrier segment formed at least partially between an opposing pair of sidewalls of adjacent electrode segments of the respective plurality of electrode segments. The ferroelectric formation component 1240 may be configured as or otherwise support a means for forming a plurality of ferroelectric layers based at least in part on forming the plurality of barrier segments, each ferroelectric layer covering at least a portion of a respective subset of the plurality of electrode segments and covering at least a portion of a respective subset of the plurality of barrier segments. The plate formation component 1245 may be configured as or otherwise support a means for forming a plurality of plates of a conductive material, each plate having a surface facing respective surfaces of electrode segments of the plurality of electrode segments.

In some examples, to support forming the plurality of electrode segments, the electrode formation component 1230 may be configured as or otherwise support a means for forming a layer of an electrode material covering at least a portion of a surface of the plurality of surfaces. In some examples, to support forming the plurality of electrode segments, the electrode formation component 1230 may be configured as or otherwise support a means for forming a placeholder material covering at least a portion of a surface of the layer of the electrode material. In some examples, to support forming the plurality of electrode segments, the electrode formation component 1230 may be configured as or otherwise support a means for removing at least a portion of the placeholder material and at least a portion of the electrode material to form the plurality of electrode segments, where removing at least the portion of the electrode material exposes respective sidewalls of each electrode segment.

In some examples, to support forming the dielectric layer, the dielectric formation component 1225 may be configured as or otherwise support a means for depositing a dielectric material to form the dielectric layer. In some examples, to support forming the dielectric layer, the dielectric formation component 1225 may be configured as or otherwise support a means for removing a plurality of portions of the dielectric layer to form a plurality of dielectric walls extending in a first direction, where the plurality of surfaces include sidewalls of the plurality of dielectric walls.

In some examples, to support forming the plurality of electrode segments, the electrode formation component 1230 may be configured as or otherwise support a means for depositing an electrode layer to cover sidewalls of each dielectric wall of the plurality of dielectric walls. In some examples, to support forming the plurality of electrode segments, the electrode formation component 1230 may be configured as or otherwise support a means for removing a plurality of portions of the electrode layer on each sidewall of respective dielectric walls to form rows of electrode segments, each electrode segment having sidewalls that are opposing to sidewalls of adjacent electrode segments.

In some examples, to support forming the plurality of barrier segments, the barrier formation component 1235 may be configured as or otherwise support a means for depositing a layer of a second dielectric material to cover the surface and sidewalls of each electrode segment of the plurality of electrode segments, the layer of the second dielectric material extending between an opposing pair of sidewalls of adjacent electrode segments of the plurality of electrode segments. In some examples, to support forming the plurality of barrier segments, the barrier formation component 1235 may be configured as or otherwise support a means for removing a portion of the layer of the second dielectric material to expose at least a portion of respective surfaces of the plurality of electrode segments.

In some examples, to support forming the dielectric layer, the dielectric formation component 1225 may be configured as or otherwise support a means for depositing a dielectric material to form the dielectric layer. In some examples, to support forming the dielectric layer, the dielectric formation component 1225 may be configured as or otherwise support a means for removing a plurality of portions of the dielectric layer to form a plurality of cavities arranged in one or more rows extending in a first direction and one or more columns extending in a second direction orthogonal to the first direction, where the plurality of surfaces include sidewalls of the plurality of cavities.

In some examples, to support forming the plurality of electrode segments, the electrode formation component 1230 may be configured as or otherwise support a means for depositing an electrode layer to cover sidewalls of each cavity of the plurality of cavities. In some examples, to support forming the plurality of electrode segments, the electrode formation component 1230 may be configured as or otherwise support a means for removing a plurality of portions of the electrode layer in each cavity to form the plurality of electrode segments, each electrode segment having a surface and having sidewalls that oppose sidewalls of adjacent electrode segments of the respective plurality of electrode segments within each cavity.

In some examples, to support forming the plurality of barrier segments, the barrier formation component 1235 may be configured as or otherwise support a means for depositing a layer of a second dielectric material in each cavity of the plurality of cavities to cover the surface and sidewalls of each electrode segment of the respective plurality of electrode segments, the layer of the second dielectric material extending between an opposing pair of sidewalls of adjacent electrode segments of the respective plurality of electrode segments. In some examples, to support forming the plurality of barrier segments, the barrier formation component 1235 may be configured as or otherwise support a means for removing a portion of the layer of second dielectric material to expose at least a portion of respective surfaces of the plurality of electrode segments.

Figure 13:
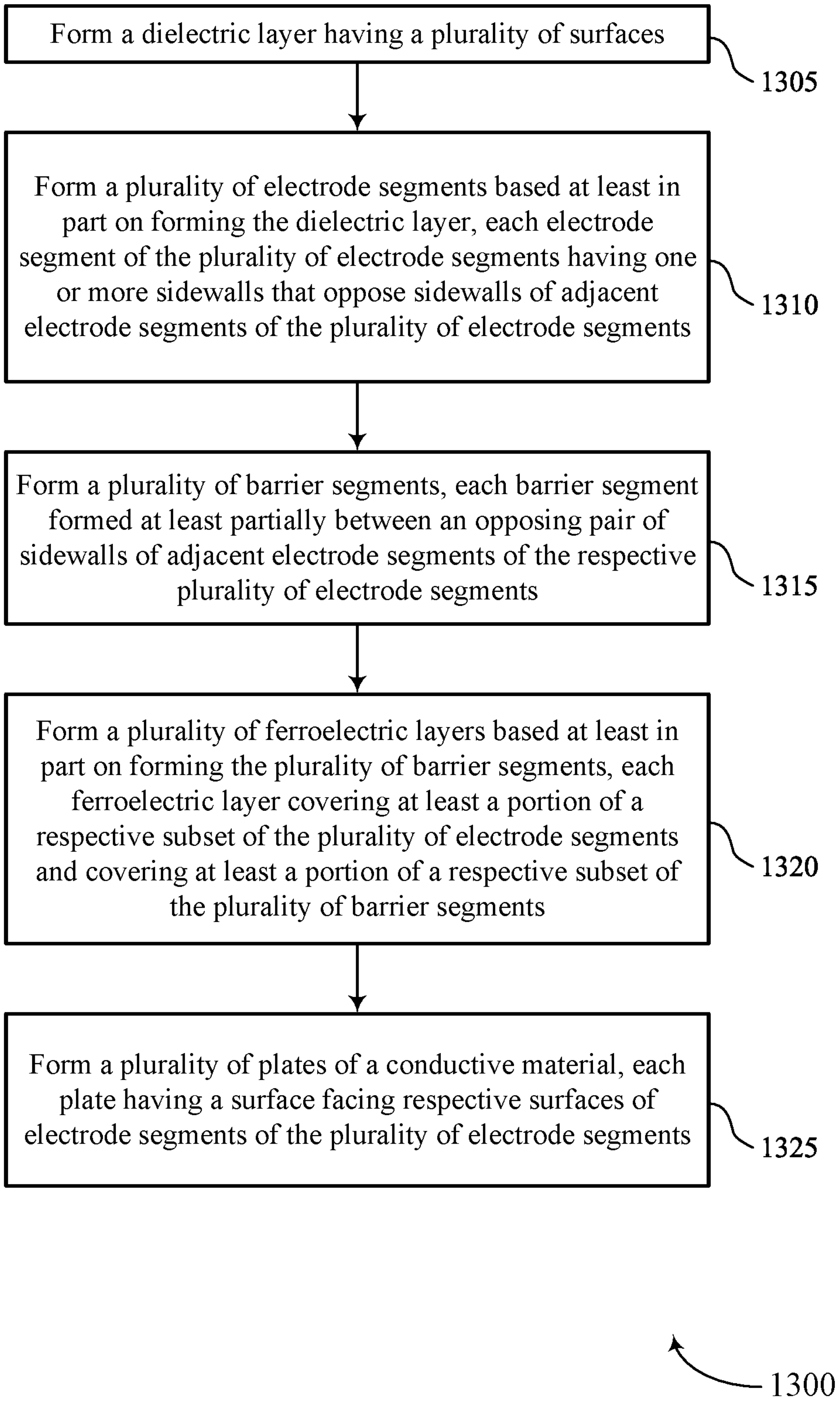
FIG. 13 shows a flowchart illustrating a method or methods that support ferroelectric memory arrays with low permittivity dielectric barriers in accordance with examples as disclosed herein.

FIG. 13 shows a flowchart illustrating a method 1300 that supports ferroelectric memory arrays with low permittivity dielectric barriers in accordance with examples as disclosed herein. The operations of method 1300 may be implemented by a processing controller or its components as described herein. For example, the operations of method 1300 may be performed by a processing controller as described with reference to FIGS. 1 through 12. In some examples, a processing controller may execute a set of instructions to control the functional elements of the device to perform the described functions. Additionally, or alternatively, the processing controller may perform aspects of the described functions using special-purpose hardware.

At 1305, the method may include forming a dielectric layer having a plurality of surfaces. The operations of 1305 may be performed in accordance with examples as disclosed herein. In some examples, aspects of the operations of 1305 may be performed by a dielectric formation component 1225 as described with reference to FIG. 12.

At 1310, the method may include forming a plurality of electrode segments based at least in part on forming the dielectric layer, each electrode segment of the plurality of electrode segments having one or more sidewalls that oppose sidewalls of adjacent electrode segments of the plurality of electrode segments. The operations of 1310 may be performed in accordance with examples as disclosed herein. In some examples, aspects of the operations of 1310 may be performed by an electrode formation component 1230 as described with reference to FIG. 12.

At 1315, the method may include forming a plurality of barrier segments, each barrier segment formed at least partially between an opposing pair of sidewalls of adjacent electrode segments of the respective plurality of electrode segments. The operations of 1315 may be performed in accordance with examples as disclosed herein. In some examples, aspects of the operations of 1315 may be performed by a barrier formation component 1235 as described with reference to FIG. 12.

At 1320, the method may include forming a plurality of ferroelectric layers based at least in part on forming the plurality of barrier segments, each ferroelectric layer covering at least a portion of a respective subset of the plurality of electrode segments and covering at least a portion of a respective subset of the plurality of barrier segments. The operations of 1320 may be performed in accordance with examples as disclosed herein. In some examples, aspects of the operations of 1320 may be performed by a ferroelectric formation component 1240 as described with reference to FIG. 12.

At 1325, the method may include forming a plurality of plates of a conductive material, each plate having a surface facing respective surfaces of electrode segments of the plurality of electrode segments. The operations of 1325 may be performed in accordance with examples as disclosed herein. In some examples, aspects of the operations of 1325 may be performed by a plate formation component 1245 as described with reference to FIG. 12.

In some examples, an apparatus as described herein may perform a method or methods, such as the method 1300. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for forming a dielectric layer having a plurality of surfaces; forming a plurality of electrode segments based at least in part on forming the dielectric layer, each electrode segment of the plurality of electrode segments having one or more sidewalls that oppose sidewalls of adjacent electrode segments of the plurality of electrode segments; forming a plurality of barrier segments, each barrier segment formed at least partially between an opposing pair of sidewalls of adjacent electrode segments of the respective plurality of electrode segments; forming a plurality of ferroelectric layers based at least in part on forming the plurality of barrier segments, each ferroelectric layer covering at least a portion of a respective subset of the plurality of electrode segments and covering at least a portion of a respective subset of the plurality of barrier segments; and forming a plurality of plates of a conductive material, each plate having a surface facing respective surfaces of electrode segments of the plurality of electrode segments.

Aspect 2: The method, apparatus, or non-transitory computer-readable medium of aspect 1 where forming the plurality of electrode segments includes operations, features, circuitry, logic, means, or instructions, or any combination thereof for forming a layer of an electrode material covering at least a portion of a surface of the plurality of surfaces; forming a placeholder material covering at least a portion of a surface of the layer of the electrode material; and removing at least a portion of the placeholder material and at least a portion of the electrode material to form the plurality of electrode segments, where removing at least the portion of the electrode material exposes respective sidewalls of each electrode segment.

Aspect 3: The method, apparatus, or non-transitory computer-readable medium of any of aspects 1 through 2 where forming the dielectric layer includes operations, features, circuitry, logic, means, or instructions, or any combination thereof for depositing a dielectric material to form the dielectric layer and removing a plurality of portions of the dielectric layer to form a plurality of dielectric walls extending in a first direction, where the plurality of surfaces include sidewalls of the plurality of dielectric walls.

Aspect 4: The method, apparatus, or non-transitory computer-readable medium of aspect 3 where forming the plurality of electrode segments includes operations, features, circuitry, logic, means, or instructions, or any combination thereof for depositing an electrode layer to cover sidewalls of each dielectric wall of the plurality of dielectric walls and removing a plurality of portions of the electrode layer on each sidewall of respective dielectric walls to form rows of electrode segments, each electrode segment having sidewalls that are opposing to sidewalls of adjacent electrode segments.

Aspect 5: The method, apparatus, or non-transitory computer-readable medium of aspect 4 where forming the plurality of barrier segments includes operations, features, circuitry, logic, means, or instructions, or any combination thereof for depositing a layer of a second dielectric material to cover the surface and sidewalls of each electrode segment of the plurality of electrode segments, the layer of the second dielectric material extending between an opposing pair of sidewalls of adjacent electrode segments of the plurality of electrode segments and removing a portion of the layer of the second dielectric material to expose at least a portion of respective surfaces of the plurality of electrode segments.

Aspect 6: The method, apparatus, or non-transitory computer-readable medium of any of aspects 1 through 5 where forming the dielectric layer includes operations, features, circuitry, logic, means, or instructions, or any combination thereof for depositing a dielectric material to form the dielectric layer and removing a plurality of portions of the dielectric layer to form a plurality of cavities arranged in one or more rows extending in a first direction and one or more columns extending in a second direction orthogonal to the first direction, where the plurality of surfaces include sidewalls of the plurality of cavities.

Aspect 7: The method, apparatus, or non-transitory computer-readable medium of aspect 6 where forming the plurality of electrode segments includes operations, features, circuitry, logic, means, or instructions, or any combination thereof for depositing an electrode layer to cover sidewalls of each cavity of the plurality of cavities and removing a plurality of portions of the electrode layer in each cavity to form the plurality of electrode segments, each electrode segment having a surface and having sidewalls that oppose sidewalls of adjacent electrode segments of the respective plurality of electrode segments within each cavity.

Aspect 8: The method, apparatus, or non-transitory computer-readable medium of any of aspects 6 through 7 where forming the plurality of barrier segments includes operations, features, circuitry, logic, means, or instructions, or any combination thereof for depositing a layer of a second dielectric material in each cavity of the plurality of cavities to cover the surface and sidewalls of each electrode segment of the respective plurality of electrode segments, the layer of the second dielectric material extending between an opposing pair of sidewalls of adjacent electrode segments of the respective plurality of electrode segments and removing a portion of the layer of second dielectric material to expose at least a portion of respective surfaces of the plurality of electrode segments.

It should be noted that the methods described herein are possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 9: An apparatus, including: a plurality of rows of electrode segments extending in a first direction, where electrode segments within a row of the plurality of rows of electrode segments have coplanar surfaces, and where at least a subset of electrode segments of the row have sidewalls that oppose sidewalls of adjacent electrode segments of the row; a plurality of dielectric segments each located at least partially between opposing sidewalls of adjacent electrode segments of a row of the plurality of rows of electrode segments; a plurality of plates of a conductive material extending in the first direction, where each plate has a surface facing respective surfaces of electrode segments of the row of the plurality of rows of electrode segments; and a plurality of layers of a ferroelectric material extending in the first direction, where each ferroelectric layer is in between the respective surfaces of a row of the plurality of rows of electrode segments and the surface of a plate of the plurality of plates.

Aspect 10: The apparatus of aspect 9, further including: a plurality of transistors arranged in one or more rows of transistors extending in the first direction and one or more columns of transistors extending in a second direction orthogonal to the first direction, each transistor including a respective first terminal; a plurality of digit lines extending in the first direction, where each digit line of the plurality of digit lines is coupled with respective second terminals of a respective row of transistors; and a plurality of word lines extending in the second direction, where each word line of the plurality of word lines is coupled with respective gates of a respective column of transistors.

Aspect 11: The apparatus of aspect 10, further including a plurality of dielectric walls, where each dielectric wall of the plurality of dielectric walls extends in the first direction, the plurality of dielectric walls including a first dielectric wall positioned between a first row of electrode segments and a second row of electrode segments adjacent to the first row and a second dielectric wall positioned between a third row of electrode segments adjacent to the second row and a fourth row of electrode segments adjacent to the third row.

Aspect 12: The apparatus of aspect 11, where the plurality of plates includes a first plate positioned between the second row of electrode segments and the third row of electrode segments.

Aspect 13: The apparatus of any of aspects 11 through 12, where the first row of electrode segments are formed on a first sidewall of the first dielectric wall and the second row of electrode segments are formed on a second sidewall of the first dielectric wall.

Aspect 14: The apparatus of any of aspects 11 through 13, where each dielectric wall of the plurality of dielectric walls includes a first dielectric material and each dielectric segment of the plurality of dielectric segments includes a second dielectric material different from the first dielectric material.

Aspect 15: The apparatus of any of aspects 9 through 14, where a permittivity of the ferroelectric layer is greater than a permittivity of a dielectric material forming the plurality of dielectric segments.

An apparatus is described. The following provides an overview of aspects of the apparatus as described herein:

Aspect 16: An apparatus, including: a layer of dielectric material including a plurality of cavities arranged in one or more rows extending in a first direction and in one or more columns extending in a second direction orthogonal to the first direction; respective sets of electrode segments at least partially within each cavity of the plurality of cavities, where each electrode segment has sidewalls that oppose sidewalls of adjacent electrode segments of the respective set of electrode segments; respective sets of barrier segments at least partially within each cavity of the plurality of cavities, where each barrier segment is positioned at least partially between an opposing pair of sidewalls of adjacent electrode segments of the respective set of electrode segments; respective posts of a conductive material at least partially within each cavity of the plurality of cavities; and respective ferroelectric layers in between the respective sets of electrode segments and the respective posts.

Aspect 17: The apparatus of aspect 16, further including: a plurality of transistors arranged in one or more rows of transistors extending in the first direction and one or more columns of transistors extending in a second direction orthogonal to the first direction, each transistor including a respective first terminal; a plurality of digit lines extending in the first direction, where each digit line of the plurality of digit lines is coupled with respective second terminals of a respective row of transistors; and a plurality of word lines extending in the second direction, where each word line of the plurality of word lines is coupled with respective gates of a respective column of transistors.

Aspect 18: The apparatus of aspect 17, where each of the respective sets of electrode segments includes: a first electrode segment coupled with a first terminal of a first transistor; a second electrode segment coupled with a first terminal of a second transistor, the second electrode segment adjacent to the first electrode segment in the first direction; and a third electrode segment coupled with a first terminal of a third transistor, the third electrode segment adjacent to the first electrode segment in the second direction, where the opposing pair of sidewalls of adjacent electrode segments includes a first sidewall of the first electrode segment and a sidewall of the second electrode segment or a second sidewall of the first electrode segment and a sidewall of the third electrode segment.

Aspect 19: The apparatus of any of aspects 16 through 18, further including a plurality of plate lines of the conductive material, where each plate line of the plurality extends in the first direction and is in contact with each post of a respective row of cavities of the plurality of cavities.

Aspect 20: The apparatus of any of aspects 16 through 19, where the layer of dielectric material includes a first dielectric material and each barrier segment of the respective sets of barrier segments includes a second dielectric material different from the first dielectric material.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, a wire, a conductive line, a conductive layer, or the like that provides a conductive path between components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:

a plurality of rows of electrode segments extending in a first direction, wherein electrode segments within a row of the plurality of rows of electrode segments have coplanar surfaces, and wherein at least a subset of electrode segments of the row have sidewalls that oppose sidewalls of adjacent electrode segments of the row, the sidewalls extending in a second direction different than the first direction;

a plurality of dielectric segments each located at least partially between, in the first direction, opposing sidewalls of adjacent electrode segments of the row of the plurality of rows of electrode segments;

a plurality of plates of a conductive material extending in the first direction, wherein each plate has a surface facing respective surfaces of electrode segments of the row of the plurality of rows of electrode segments; and a plurality of layers of a ferroelectric material extending in the first direction, wherein each ferroelectric layer is in between the respective surfaces of the row of the plurality of rows of electrode segments and the surface of a plate of the plurality of plates.

2. The apparatus of claim 1, further comprising:

a plurality of transistors arranged in one or more rows of transistors extending in the first direction and one or more columns of transistors extending in a direction orthogonal to the first direction, each transistor comprising a respective first terminal;

a plurality of digit lines extending in the first direction, wherein each digit line of the plurality of digit lines is coupled with respective second terminals of a respective row of transistors; and a plurality of word lines extending in the second direction, wherein each word line of the plurality of word lines is coupled with respective gates of a respective column of transistors.

3. The apparatus of claim 2, further comprising a plurality of dielectric walls, wherein each dielectric wall of the plurality of dielectric walls extends in the first direction, the plurality of dielectric walls comprising a first dielectric wall positioned between a first row of electrode segments and a second row of electrode segments adjacent to the first row and a second dielectric wall positioned between a third row of electrode segments adjacent to the second row and a fourth row of electrode segments adjacent to the third row.

4. The apparatus of claim 3, wherein the plurality of plates comprises a first plate positioned between the second row of electrode segments and the third row of electrode segments.

5. The apparatus of claim 3, wherein the first row of electrode segments are formed on a first sidewall of the first dielectric wall and the second row of electrode segments are formed on a second sidewall of the first dielectric wall.

6. The apparatus of claim 3, wherein each dielectric wall of the plurality of dielectric walls comprises a first dielectric material and each dielectric segment of the plurality of dielectric segments comprises a second dielectric material different from the first dielectric material.

7. The apparatus of claim 1, wherein a permittivity of the ferroelectric material is greater than a permittivity of a dielectric material forming the plurality of dielectric segments.

8. An apparatus, comprising:

a layer of dielectric material comprising a plurality of cavities arranged in one or more rows extending in a first direction and in one or more columns extending in a second direction orthogonal to the first direction;

respective sets of electrode segments at least partially within each cavity of the plurality of cavities, wherein each electrode segment comprises:

a first portion extending in a third direction; and a second portion, coupled with the first portion, extending in the first direction and the second direction;

respective sets of barrier segments at least partially within each cavity of the plurality of cavities, wherein each barrier segment is positioned at least partially between second portions of each respective set of electrode segments;

respective posts of a conductive material at least partially within each cavity of the plurality of cavities; and respective ferroelectric layers in between the respective sets of electrode segments and the respective posts.

9. The apparatus of claim 8, further comprising:

a plurality of transistors arranged in one or more rows of transistors extending in the first direction and one or more columns of transistors extending in a direction orthogonal to the first direction, each transistor comprising a respective first terminal;

a plurality of digit lines extending in the first direction, wherein each digit line of the plurality of digit lines is coupled with respective second terminals of a respective row of transistors; and a plurality of word lines extending in the second direction, wherein each word line of the plurality of word lines is coupled with respective gates of a respective column of transistors.

10. The apparatus of claim 9, wherein each of the respective sets of electrode segments comprises:

a first electrode segment coupled with a first terminal of a first transistor;

a second electrode segment coupled with a first terminal of a second transistor, the second electrode segment adjacent to the first electrode segment in the first direction; and a third electrode segment coupled with a first terminal of a third transistor, the third electrode segment adjacent to the first electrode segment in the second direction, wherein an opposing pair of sidewalls of adjacent electrode segments comprises a first sidewall of the first electrode segment and a sidewall of the second electrode segment or a second sidewall of the first electrode segment and a sidewall of the third electrode segment.

11. The apparatus of claim 8, further comprising a plurality of plate lines of the conductive material, wherein each plate line of the plurality extends in the first direction and is in contact with each post of a respective row of cavities of the plurality of cavities.

12. The apparatus of claim 8, wherein the layer of dielectric material comprises a first dielectric material and each barrier segment of the respective sets of barrier segments comprises a second dielectric material different from the first dielectric material.

* * * * *